United States Patent
Cao et al.

(10) Patent No.: US 12,089,454 B2
(45) Date of Patent: Sep. 10, 2024

(54) DOUBLE-SIDED DISPLAY PANEL, METHOD OF MANUFACTURING DOUBLE-SIDED DISPLAY PANEL, AND ELECTRONIC EQUIPMENT

(71) Applicant: SHENZHEN CHINA STAR OPTOELECTRONICS SEMICONDUCTOR DISPLAY TECHNOLOGY CO., LTD, Guangdong (CN)

(72) Inventors: Weiran Cao, Guangdong (CN); Libin Zhou, Guangdong (CN)

(73) Assignee: Shenzhen China Star Optoelectronics Semiconductor Display Technology Co., Ltd, Guangdong (CN)

( * ) Notice: Subject to any disclaimer, the term of this patent is extended or adjusted under 35 U.S.C. 154(b) by 0 days.

(21) Appl. No.: 17/622,819

(22) PCT Filed: Dec. 20, 2021

(86) PCT No.: PCT/CN2021/139516
§ 371 (c)(1),
(2) Date: Dec. 25, 2021

(87) PCT Pub. No.: WO2023/108668
PCT Pub. Date: Jun. 22, 2023

(65) Prior Publication Data
US 2024/0032352 A1   Jan. 25, 2024

(30) Foreign Application Priority Data
Dec. 13, 2021   (CN) .......................... 202111521919.1

(51) Int. Cl.
*H10K 59/12*   (2023.01)
*H10K 59/121*   (2023.01)
(Continued)

(52) U.S. Cl.
CPC ..... *H10K 59/1275* (2023.02); *H10K 59/1201* (2023.02); *H10K 59/1213* (2023.02);
(Continued)

(58) Field of Classification Search
None
See application file for complete search history.

(56) References Cited

U.S. PATENT DOCUMENTS 11,205,690 B2 *   12/2021   Zeng .................. H01L 29/78633
2007/0057932 A1 *   3/2007   Shin .................. H10K 59/8793
                                                            345/204

(Continued)

FOREIGN PATENT DOCUMENTS

CN   102890906 A   1/2013
CN   103730485 A   4/2014
(Continued)

OTHER PUBLICATIONS

Chinese Office Action issued in corresponding Chinese Patent Application No. 202111521919.1 dated Jan. 20, 2023, pp. 1-8.
(Continued)

*Primary Examiner* — Bilkis Jahan
(74) *Attorney, Agent, or Firm* — PV IP PC; Wei Te Chung (57) ABSTRACT

A double-sided display panel, a method of manufacturing the double-sided display panel, and electronic equipment. In the double-sided display panel provided by an embodiment of the present application, by providing a light-emitting device layer on a front side of the panel and an electrochromic layer on a back side of the panel, front and back sides of the panel can achieve display effects. In addition, a first light-shielding conductive layer is also provided between the light-emitting device layer and the electrochromic layer,
(Continued)

thereby improving the display effects of the front and back sides of the double-sided display panel.

20 Claims, 3 Drawing Sheets

(51) Int. Cl.
    *H10K 59/126*     (2023.01)
    *H10K 59/127*     (2023.01)
    *H10K 59/50*     (2023.01)
    *H10K 59/80*     (2023.01)
    *H10K 77/10*     (2023.01)
    *H10K 102/00*     (2023.01)

(52) U.S. Cl.
    CPC .......... *H10K 59/126* (2023.02); *H10K 59/50* (2023.02); *H10K 59/8792* (2023.02); *H10K 77/111* (2023.02); *H10K 2102/3031* (2023.02)

(56) References Cited

U.S. PATENT DOCUMENTS

| | | | |
|---|---|---|---|
| 2007/0069995 A1* | 3/2007 | Shin | H10K 59/12 345/76 |
| 2007/0138941 A1* | 6/2007 | Jin | H10K 59/12 313/503 |
| 2016/0329381 A1 | 11/2016 | Xu et al. | |
| 2020/0381501 A1* | 12/2020 | Zeng | H10K 59/122 |
| 2021/0066666 A1* | 3/2021 | Li | H10K 59/122 |
| 2022/0209175 A1* | 6/2022 | Tian | H10K 50/828 |

FOREIGN PATENT DOCUMENTS

| | | |
|---|---|---|
| CN | 105140260 A | 12/2015 |
| CN | 106024846 A | 10/2016 |
| CN | 107680989 A | 2/2018 |
| CN | 111142302 A | 5/2020 |
| CN | 113745289 A | 12/2021 |
| JP | 2005055514 A | 3/2005 |
| JP | 2018528455 A | 9/2018 |
| JP | 2021067707 A | 4/2021 |
| KR | 20150060051 A | 6/2015 |

OTHER PUBLICATIONS

International Search Report in International application No. PCT/CN2021/139516, mailed on Sep. 2, 2022.
Written Opinion of the International Search Authority in International application No. PCT/CN2021/139516, mailed on Sep. 2, 2022.
Japanese Office Action issued in corresponding Japanese Patent Application No. 特願 2021-577840 dated Feb. 6, 2024, pp. 1-3.

* cited by examiner

DOUBLE-SIDED DISPLAY PANEL, METHOD OF MANUFACTURING DOUBLE-SIDED DISPLAY PANEL, AND ELECTRONIC EQUIPMENT

BACKGROUND OF INVENTION

Field of Invention

The present application relates to the field of display technology, and in particular to a double-sided display panel, a method of manufacturing the double-sided display panel, and an electronic equipment.

Description of Prior Art

At present, the display panel is mainly single-sided display, but in many occasions, such as digital signage, advertising broadcasting facilities in public areas including exhibition halls etc., there are often situations where two people watch display images at the same time from front and back sides of a display panel.

In addition, in window industries such as communication industry, government window, financial industry, transportation industry, and so on, two-way display is also required, so that people inside and outside the window can view displayed information.

SUMMARY OF INVENTION

Embodiments of the present application provide a double-sided display panel, a method of manufacturing a double-sided display panel, and an electronic device, wherein both a front side and a back side of the double-sided display panel can display images, thus providing an effect of double-sided display.

In the first aspect, an embodiment of the present application provides a double-sided display panel, including:
- a light-emitting device layer including a plurality of light-emitting devices;
- a thin film transistor (TFT) layer disposed on a side of the light-emitting device layer, wherein the TFT layer includes a first TFT and a second TFT, and the first TFT is electrically connected to one of the light-emitting devices;
- a first light-shielding conductive layer disposed on a side of the TFT layer away from the light-emitting device layer, and electrically connected to the second TFT;
- an electrochromic layer disposed on a side of the first light-shielding conductive layer away from the TFT layer, and electrically connected to the first light-shielding conductive layer; and
- a light-transmitting conductive layer disposed on a side of the electrochromic layer away from the first light-shielding conductive layer, and electrically connected to the electrochromic layer.

In some embodiments, a first substrate and a first inorganic layer are disposed between the TFT layer and the first light-shielding conductive layer, the first substrate is disposed close to the TFT layer, and the first inorganic layer is disposed close to the first light-shielding conductive layer;
wherein a second substrate and a second inorganic layer are disposed on a side of the light-transmitting conductive layer away from the electrochromic layer, and the second inorganic layer is disposed between the first light-shielding conductive layer and the second substrate; and wherein the first substrate and the second substrate are both flexible substrates.

In some embodiments, a second light-shielding conductive layer is disposed between the first substrate and the TFT layer, a source-drain layer of the second TFT and the first light-shielding conductive layer are both electrically connected to the second light-shielding conductive layer.

In some embodiments, the double-sided display panel is defined with a display area and a bonding area; in the bonding area, a through hole is defined through the electrochromic layer, the first light-shielding conductive layer, the first inorganic layer, and the first substrate; a part of the second light-shielding conductive layer covers a sidewall of the through hole and is in contact with the light-transmitting conductive layer at a bottom of the through hole; and an area of the second light-shielding conductive layer in contact with the first light-shielding conductive layer is not connected to an area of the second light-shielding conductive layer in contact with the light-transmitting conductive layer.

In some embodiments, the through hole includes a first via hole defined in the electrochromic layer, a second via hole defined in the first light-shielding conductive layer, a third via hole defined in the first inorganic layer, and a fourth via hole defined in the first substrate; cross-sectional areas of the first via hole, the second via hole, the third via hole, and the fourth via hole increase sequentially.

In some embodiments, a material of each of the first inorganic layer and the second inorganic layer includes at least one of silicon oxide and silicon nitride.

In some embodiments, a material of the first light-shielding conductive layer includes metal; and/or
  a material of the light-transmitting conductive layer includes a transparent conductive metal oxide.

In some embodiments, a material of the first light-shielding conductive layer includes at least one of silver, molybdenum, titanium, or copper; and/or
  a material of the light-transmitting conductive layer includes indium tin oxide.

In some embodiments, the light-emitting device is an OLED.

In some embodiments, the electrochromic layer includes a plurality of electrochromic units disposed at intervals, the first light-shielding conductive layer includes a plurality of conductive units, each of the electrochromic units is arranged corresponding to and electrically connected to one of the conductive units, and each of the conductive units is electrically connected to the source-drain layer of the second TFT.

In some embodiments, the TFT layer further includes a third TFT, a drain of the third TFT is connected to a gate of the second TFT, a source of the second TFT is connected to a driving power source, and a drain of the second TFT is connected to the electrochromic layer.

In a second aspect, an embodiment of the present application also provides a method of manufacturing a double-sided display panel, including:
  stacking a second substrate, a second inorganic layer, a light-transmitting conductive layer, an electrochromic layer, a first light-shielding conductive layer, a first inorganic layer, a first substrate, a thin film transistor (TFT) layer, and a light-emitting device layer in sequence to obtain the double-sided display panel;
  wherein the light-emitting device layer includes a plurality of light-emitting devices, the TFT layer includes a first TFT and a second TFT, the first TFT is electrically connected to one of the light-emitting devices to drive the light-emitting devices to emit light, and the second TFT is electrically connected to the electrochromic layer to drive the electrochromic layer to change color.

In some embodiments, the first substrate and the second substrate are both flexible substrates; and the manufacturing method further includes: providing a carrier substrate, preparing the double-sided display panel on the carrier substrate, and peeling the double-sided display panel from the carrier substrate after the double-sided display panel is prepared.

In some embodiments, the double-sided display panel is defined with a display area and a bonding area; during processes of forming the electrochromic layer, the first light-shielding conductive layer, and the second inorganic layer, and the first substrate, a first via hole, a second via hole, a third via hole, and a fourth via hole are formed in the electrochromic layer, the first light-shielding conductive layer, the first inorganic layer, and the first substrate, respectively; and the first via hole, the second via hole, the third via hole, and the fourth via hole are defined correspondingly and communicated to each other.

In some embodiments, in a process of preparing the double-sided display panel, a second light-shielding conductive layer is disposed between the first substrate and the TFT layer, and a source-drain layer of the second TFT and the first light-shielding conductive layer are both electrically connected to the second light-shielding conductive layer; the first via hole, the second via hole, the third via hole, and the fourth via hole collectively constitute a through hole; a part of the second light-shielding conductive layer covers a sidewall of the through hole and is in contact with the light-transmitting conductive layer at a bottom of the through hole; and an area of the second light-shielding conductive layer in contact with the first light-shielding conductive layer is not connected to an area of the second light-shielding conductive layer in contact with the light-transmitting conductive layer.

In some embodiments, a material of each of the first inorganic layer and the second inorganic layer includes at least one of silicon oxide and silicon nitride.

In some embodiments, a material of the first light-shielding conductive layer includes metal; and/or a material of the light-transmitting conductive layer includes a transparent conductive metal oxide.

In some embodiments, a material of the first light-shielding conductive layer includes at least one of silver, molybdenum, titanium, or copper; and/or a material of the light-transmitting conductive layer includes indium tin oxide.

In some embodiments, the light-emitting device is an OLED.

In a third aspect, an embodiment of the present application also provides an electronic device, including the double-sided display panel described above or the double-sided display panel manufactured by the manufacturing method described above.

In the double-sided display panel provided by an embodiment of the present application, by providing a light-emitting device layer on a front side of the panel and an electrochromic layer on a back side of the panel, and arranging a thin film transistor (TFT) layer between the light-emitting device layer and the electrochromic layer, wherein a first TFT and a second TFT in the TFT layer can be used to respectively control the light-emitting device layer and the electrochromic layer, so that the front and back sides of the panel can achieve display effects. In addition, a first light-shielding conductive layer is also provided between the light-emitting device layer and the electrochromic layer, wherein the first light-shielding conductive layer can not only serve as an anode of the electrochromic layer to input a driving voltage into the electrochromic layer, but also has a light-shielding function and prevent display images of the front and back sides of the double-sided display panel from interfering with each other, thereby improving the display effects of the front and back sides of the double-sided display panel respectively.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

In order to have a more complete understanding of the present application and its beneficial effects, the description will be given below in conjunction with the accompanying drawings. The same reference numerals in the following description indicate the same elements.

DETAILED DESCRIPTION OF PREFERRED EMBODIMENTS

The technical solutions in the embodiments of the present application will be clearly and completely described in the following referring to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Figure 1:
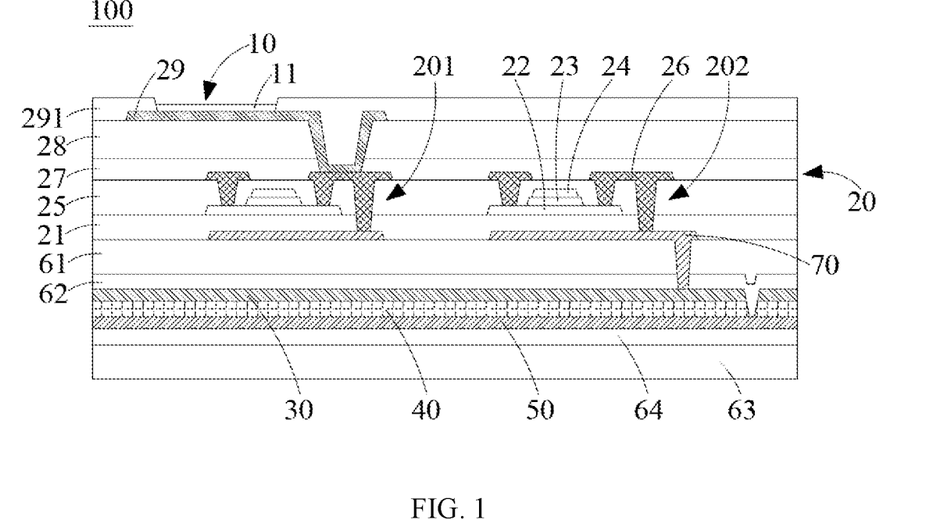
FIG. 1 is a first cross-sectional structural diagram of a display area of a double-sided display panel provided by an embodiment of the present application.
Figure 2:
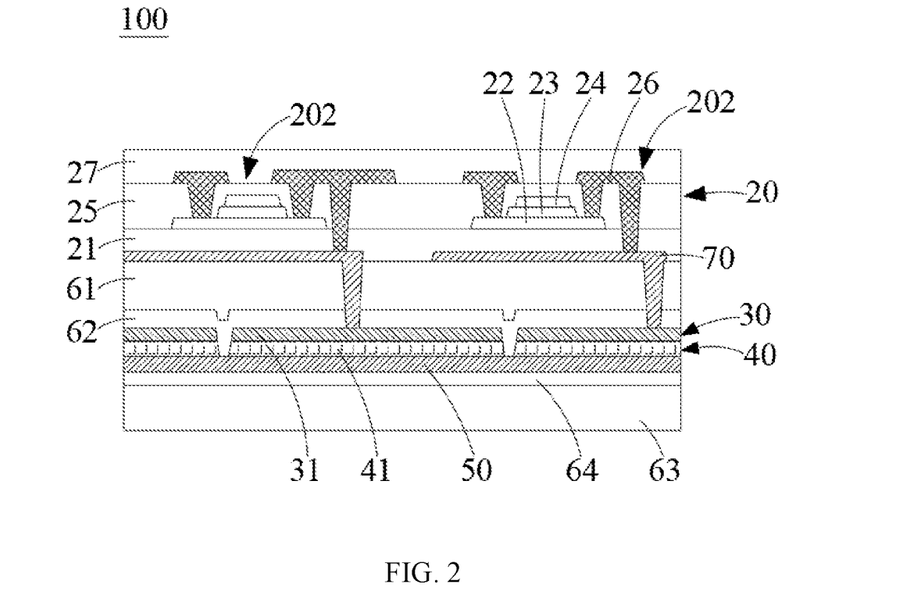
FIG. 2 is a second cross-sectional structural diagram of a display area of a double-sided display panel provided by an embodiment of the present application.

Referring to FIGS. 1 and 2, FIG. 1 is a first cross-sectional structural diagram of a display area of a double-sided display panel provided by an embodiment of the present application, and FIG. 2 is a second cross-sectional structural diagram of a display area of a double-sided display panel provided by an embodiment of the present application. An embodiment of the present application provides a double-sided display panel 100, which includes a light-emitting device layer 10, a thin film transistor (TFT) layer 20, a first light-shielding conductive layer 30, an electrochromic layer 40, and a light-transmitting conductive layer 50 that are stacked in sequence. The light-emitting device layer 10 includes a plurality of light-emitting devices 11.

The TFT layer 20 is provided on one side of the light-emitting device layer 10. The TFT layer 20 includes a first TFT 201 and a second TFT 202. The first TFT 201 is electrically connected to the light-emitting device 11 to drive the light-emitting device 11 to emit light; the first light-shielding conductive layer 30 is arranged on a side of the TFT layer 20 away from the light-emitting device layer 10 and is electrically connected to the second TFT 202; the electrochromic layer 40 is arranged on a side of the first light-shielding conductive layer 30 away from the TFT layer 20 and is electrically connected to the first light-shielding conductive layer 30; and the light-transmitting conductive layer 50 is disposed on a side of the electrochromic layer 40 away from the first light-shielding conductive layer 30 and is electrically connected to the electrochromic layer 40.

Exemplarily, both the first light-shielding conductive layer 30 and the light-transmitting conductive layer 50 are in direct contact with the electrochromic layer 40.

Exemplarily, a light transmittance of the light-transmitting conductive layer 50 may be 40% or more, such as 40%, 50%, 60%, 70%, 80%, 90%, 95%, 99%, 100%, etc.

Exemplarily, a light transmittance of the first light-shielding conductive layer 30 may be 30% or less, such as 30%, 25%, 20%, 15%, 10%, 5%, 0, etc.

It should be noted that by disposing the first light-shielding conductive layer 30 and the light-transmitting conductive layer 50 on opposite sides of the electrochromic layer 40, respectively, the first light-shielding conductive layer 30 and the light-transmitting conductive layer 50 can be used as the anode and cathode of the electrochromic layer, respectively. Since the first light-shielding conductive layer 30 is electrically connected to the second TFT 202, that is to say, a driving voltage applied to the electrochromic layer 40 can be controlled by the second TFT 202, when the driving voltage of the electrochromic layer 40 changes, a color of the electrochromic layer 40 also changes. It is appreciated that the first light-shielding conductive layer 30 can function as an anode on the one hand, and provide a light-shielding effect on the other hand, which can prevent the display images on the front and back sides of the double-sided display panel 100 from interfering with each other, thereby improving the display effects of the front and back sides of the double-sided display panel 100 respectively. The light-transmitting conductive layer 50 can function as a cathode on the one hand, and provide a light-transmitting effect on the other hand, so that a user can see a color effect of the electrochromic layer 40 from a side of the light-transmitting conductive layer 50.

In the double-sided display panel 100 provided by an embodiment of the present application, by providing a light-emitting device layer 10 on a front side of the panel and an electrochromic layer 40 on a back side of the panel, and arranging a thin film transistor (TFT) layer 20 between the light-emitting device layer 10 and the electrochromic layer 40, wherein a first TFT 201 and a second TFT 202 in the TFT layer 20 can be used to respectively control the light-emitting device layer 10 and the electrochromic layer 40, so that the front and back sides of the panel can achieve display effects. In addition, a first light-shielding conductive layer 30 is also provided between the light-emitting device layer 10 and the electrochromic layer 40, wherein the first light-shielding conductive layer 30 can not only serve as a anode of the electrochromic layer 40 to input a driving voltage into the electrochromic layer, but also can has a light-shielding function and prevent display images of the front and back sides of the double-sided display panel 100 from interfering with each other, thereby improving the display effects of the front and back sides of the double-sided display panel 10 respectively.

Referring to FIG. 1, a first substrate 61 and a first inorganic layer 62 may be disposed between the TFT layer 20 and the first light-shielding conductive layer 30, wherein the first substrate 61 is disposed close to the TFT layer 20, and the first inorganic layer 62 is disposed close to the first light-shielding conductive layer 30; wherein a second substrate 63 and a second inorganic layer 64 are disposed on a side of the light-transmitting conductive layer 50 away from the electrochromic layer 40, and the second inorganic layer 64 is disposed between the first light-shielding conductive layer 30 and the second substrate 63; and wherein the first substrate 61 and the second substrate 62 are both flexible substrates.

It should be noted that, in an embodiment of the present application, the first substrate 61 and the second substrate 63 are provided in the double-sided display panel 100, that is, the substrates of the double-sided display panel 100 are set as flexible substrates, so that the double-sided display panel 100 is formed into a bendable flexible display panel, wherein the first inorganic layer 62 can play a role in enhancing an adhesion between the first substrate 61 and the first light-shielding conductive layer 30, and the second inorganic layer 64 can play a role in enhancing an adhesive between the second substrate 63 and the light-transmitting conductive layer 50, so that a stability of the stacked structure can be improved.

Exemplarily, a second light-shielding conductive layer 70 is provided between the first substrate 61 and the TFT layer 20, and a source-drain layer 26 of the second TFT 202 and the first light-shielding conductive layer 30 are both electrically connected to the second light-shielding conductive layer 70. It should be noted that the second light-shielding conductive layer 70 can function as an electrical connection between the second TFT 202 and an anode (i.e., the first light-shielding conductive layer 30) of the electrochromic layer 40, so that the second TFT 202 can be used to output a driving voltage to the electrochromic layer 40. In addition, the first light-shielding conductive layer 30 also has a light-shielding function, which can further prevent the display images on the front and back sides of the double-sided display panel 100 from interfering with each other, thereby improving the display images on the front and back sides of the double-sided display panel 100. It is appreciated that the second light-shielding conductive layer 70 can also protect the active layer 22, thus preventing light from irradiating an active layer 22 and causing its performance to decrease.

Exemplarily, a light transmittance of the second light-shielding conductive layer 70 may be 30% or less, such as 30%, 25%, 20%, 15%, 10%, 5%, 0, etc.

Exemplarily, a material of the first substrate 61 may be photosensitive polyimide or ordinary polyimide, and a material of the second substrate 63 may be photosensitive polyimide or ordinary polyimide.

Figure 3:
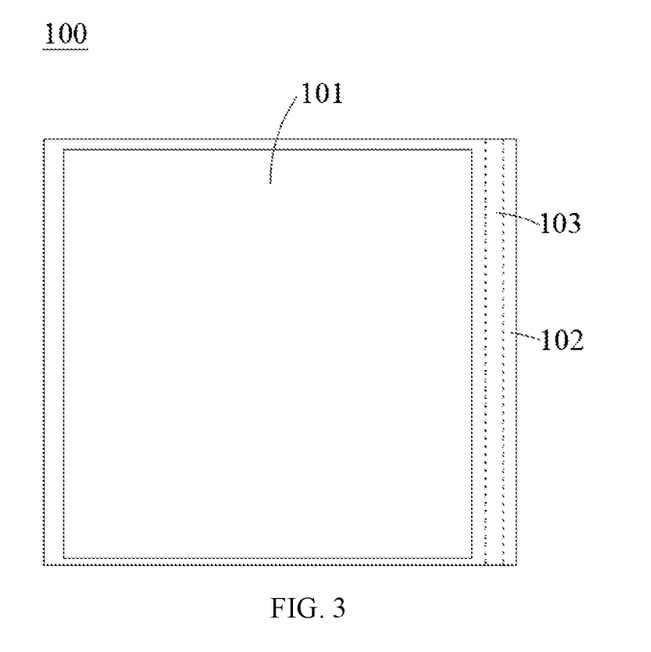
FIG. 3 is a schematic top view of a double-sided display panel provided by an embodiment of the present application.
Figure 4:
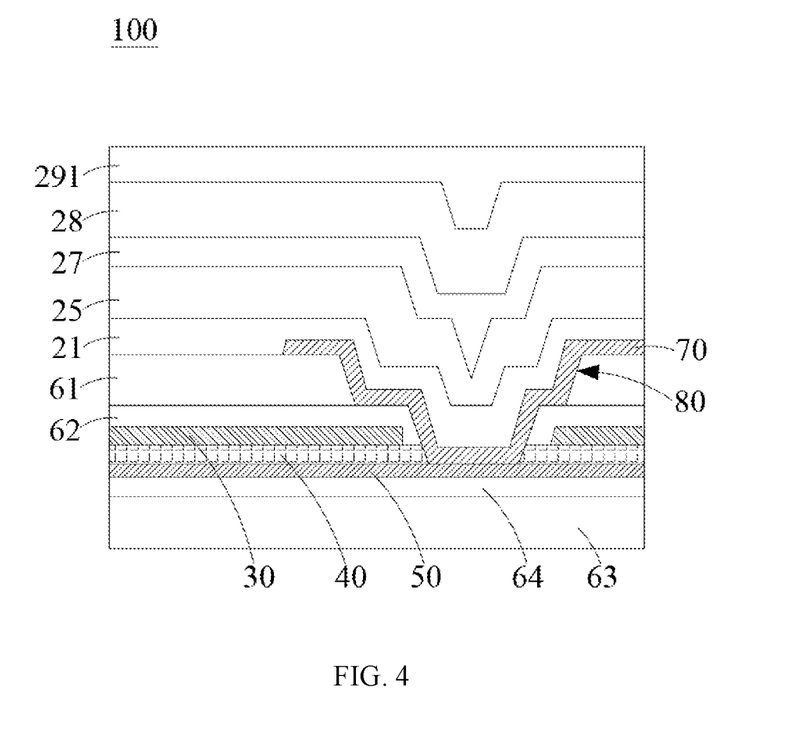
FIG. 4 is a cross-sectional structural diagram of a bonding area of a double-sided display panel provided by an embodiment of the present application.

Referring to FIGS. 3 and 4, FIG. 3 is a schematic top view of a double-sided display panel provided by an embodiment of the present application, and FIG. 4 is a schematic cross-sectional structure view of a bonding area of a double-sided display panel provided by an embodiment of the present application. The double-sided display panel 100 is defined with a display area 101 and a bonding area 102; in the bonding area 102, a through hole 80 is defined through the electrochromic layer 40, the first light-shielding conductive layer 30, the first inorganic layer 62, and the first substrate 61; a part of the second light-shielding conductive layer 70 covers a sidewall of the through hole 80 and is in contact with the light-transmitting conductive layer 50 at a bottom of the through hole 8. It should be noted that the area on the second light-shielding conductive layer 70 in contact with the first light-shielding conductive layer 30 (located in the display area 101) is not connected to the area on the second light-shielding conductive layer 70 in contact with the light-transmitting conductive layer 50 (located in the bonding area 102), that is, there is no electrical connection between the two areas. In addition, by arranging a part of the second light-shielding conductive layer 70 to be electrically connected to the light-transmitting conductive layer 50 (a cathode of the electrochromic layer 40), the cathode can be drawn out so that the cathode a complete current loop can be formed between the cathode and the anode of the electrochromic layer 40.

It is appreciated that the bonding area 102 refers to an area on the double-sided display panel 100 for connection with a circuit board. In some cases, after the bonding area 102 of the double-sided display panel 100 is connected to a circuit board (such as a chip-on-film (COF)), the bonding area 102 needs to be bent to reduce the area occupied by the bonding area 102 in the double-sided display panel 100, to increase a proportion of the display area 101 in the double-sided display panel 100. In the double-sided display panel 100 provided by an embodiment of the present application, the through hole 80 is defined through the first light-shielding conductive layer 30, the first inorganic layer 62, and the first substrate 61; the through hole 80 and the light-transmitting conductive layer 50 located at the bottom of the through hole 80 enclose a groove; and by arranging a second light-shielding conductive layer 70 at a position of the groove, and making the second light-shielding conductive layer 70 cover a groove wall and a groove bottom of the groove, when the double-sided display panel 100 is bent at the groove, since the second light-shielding conductive layer 70 at the bottom of the groove has a smaller bending radius (compared to a case that a bending position of the double-sided display panel 100 is provided with no groove), the stress can be relieved and the second light-shielding conductive layer 70 can be prevented from being broken. In addition, since a material of the second light-shielding conductive layer 70 is usually a metal material, a material of the light-transmitting conductive layer 50 is usually a transparent conductive metal oxide, and both the metal material and the transparent conductive metal oxide have good bendability, they can play a role in enhancing a bending resistance of the double-sided display panel 100.

Referring to FIG. 3, a bending area 103 may be defined in the bonding area 102. After the bonding area 102 of the double-sided display panel 100 is connected to a circuit board (such as a chip-on-film (COF)), the bonding area 102 can be bent at the bending area 103 to reduce the area occupied by the bonding area 102 in the double-sided display panel 100.

Referring to FIG. 4, the through hole 80 may include a first via hole defined in the electrochromic layer 40, a second via hole defined in the first light-shielding conductive layer 30, a third via hole defined in the first inorganic layer 62, a fourth via hole defined in the first substrate 61. The cross-sectional areas of the first via hole, the second via hole, the third via hole, and the fourth via hole increase sequentially. In other words, a cross-sectional area of the second via hole is greater than a cross-sectional area of the first via hole, a cross-sectional area of the third via hole is greater than a cross-sectional area of the second via hole, and a cross-sectional area of the fourth via hole is greater than the cross-sectional area of the third via hole, so that the through hole 80 forms a stepped through hole. It is appreciated that the stepped through hole 80 is more conducive to the adhesion of the second light-shielding conductive layer 70 on the hole wall compared to the through hole with the same upper and lower diameters.

Exemplarily, a material of the first light-shielding conductive layer 30 includes metal, such as silver (Ag), molybdenum (Mo), titanium (Ti), copper (Cu), and the like.

Exemplarily, a material of the light-transmitting conductive layer 50 includes a transparent conductive metal oxide, such as indium tin oxide (ITO).

Exemplarily, a material of the second light-shielding conductive layer 70 may include metal, such as silver (Ag), molybdenum (Mo), titanium (Ti), copper (Cu), and the like.

Exemplarily, each of a material of the first inorganic layer 62 and a material of the second inorganic layer 64 may be at least one of silicon oxide (SiOx) and silicon nitride (SiNx).

Exemplarily, the light-emitting device 11 is an OLED. In other words, the front side of the double-sided display panel 100 provides an OLED display effect.

Referring to FIG. 2, the electrochromic layer 40 may include a plurality of electrochromic units 41 arranged at intervals, and the first light-shielding conductive layer 30 includes a plurality of conductive units 31, and each of the electrochromic units 41 is arranged corresponding to and electrically connected to one of the conductive units 31, each of the conductive units 31 is electrically connected to the source-drain layer 26 of the second TFT 202. In other words, the plurality of electrochromic units 41 can be controlled by the plurality of second TFTs 202 respectively, so that the plurality of electrochromic units 41 can respectively exhibit different brightness and/or colors, and the plurality of electrochromic units 41 are combined into various patterns, that is, the electrochromic layer 40 exhibits various display effects under different control conditions.

It is appreciated that each of the electrochromic units 41 corresponds to a pixel unit, that is to say, the plurality of electrochromic units 41 respectively constitute a plurality of pixel units on the back side of the double-sided display panel 100. By independently controlling the plurality of pixel units, the plurality of pixel units are combined to form different patterns or texts, thereby presenting different display effects.

Exemplarily, a material of the electrochromic layer 40 may include one or more of polypyrrole-based electrochromic materials, polythiophene-based electrochromic materials, polyfuran-based electrochromic materials, and polybenzazole-based electrochromic materials.

Referring to FIGS. 1 and 2, the TFT layer 20 may include a buffer layer 21, an active layer 22, a gate insulating layer 23, a gate electrode 24, and an inter-dielectric layer 25, a source-drain layer 26, a passivation layer 27, a planarization layer 28, an anode 29, and a pixel definition layer 291 that are sequentially stacked on the second light-shielding conductive layer 70 and the first substrate 61. The pixel definition layer 291 is provided with an opening corresponding to the anode 29; the light-emitting device 11 is provided in the opening; the planarization layer 28 and the passivation layer 27 are provided with a fifth via hole, and the anode 29 is connected to the source-drain layer 26 of the TFT 201 through the fifth via hole; the interlayer dielectric layer 25 is provided with a sixth via hole, the source-drain layer 26 is connected to the active layer 22 through the sixth via hole; and the interlayer dielectric layer 25 and the buffer layer 21 are provided with a seventh through hole 80, and the source-drain layer 26 is connected to the second light-shielding conductive layer 70 through the seventh through hole.

Figure 5:
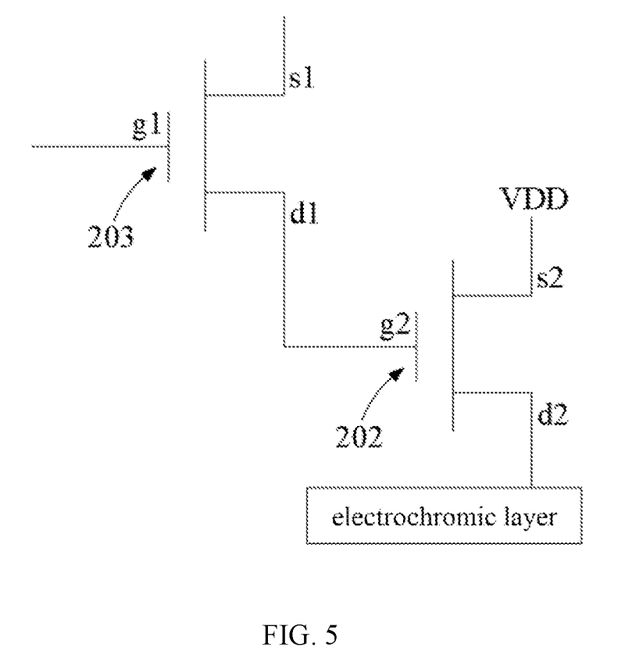
FIG. 5 is a schematic structural diagram of a driving circuit of an electrochromic layer provided by an embodiment of the present application.

Referring to FIG. 5, FIG. 5 is a schematic structural diagram of a driving circuit of an electrochromic layer provided by an embodiment of the present application. The driving circuit of the electrochromic layer 40 includes the second TFT 202 and the third TFT 203 connected in series. The second TFT 202 and the third TFT 203 are both located in the TFT layer 20. As shown in FIG. 5, g1, s1, d1 represent the gate, the source, and the drain of the third TFT 203, respectively; g2, s2, d2 represent the gate, the source, and the drain of the second TFT 202, respectively. The drain of the third TFT 203 is connected to the gate of the second TFT 202, the source of the second TFT 202 is connected to a positive electrode (VDD) of the driving power supply, and the drain of the second TFT 202 is connected to the electrochromic layer 40, that is, the third TFT 203 is used to control on or off of the second TFT 202, and control a color change of the electrochromic layer 40 through the driving voltage input from the source of the second TFT 202. It is appreciated that by adding a third TFT 203 to the TFT layer 20 to control on or off of the second TFT 202, the stability of the driving circuit of the electrochromic layer 40 can be improved.

Referring to FIGS. 1 to 5, an embodiment of the present application also provides a method of manufacturing a double-sided display panel, which can be used to manufacture the double-sided display panel 100 in any of the above embodiments, the manufacturing method may include: sequentially stacking a second substrate 63, a second inorganic layer 64, a light-transmitting conductive layer 50, an electrochromic layer 40, a first light-shielding conductive layer 30, a first inorganic layer 62, a first substrate 61, a thin film transistor (TFT) layer 20, and a light-emitting device layer 10 to obtain the double-sided display panel 100; wherein the light-emitting device layer 10 includes a plurality of light-emitting devices 11, the TFT layer 20 includes a first TFT 201 and a second TFT 202, the first TFT 201 is electrically connected to one of the light-emitting devices 11 to drive the light-emitting devices 11 to emit light, and the second TFT 202 is electrically connected to the electrochromic layer 40 to drive the electrochromic layer 40 to change color.

Exemplarily, the first substrate 61 and the second substrate 63 are both flexible substrates. When the first substrate 61 and the second substrate 63 are both flexible substrates, the method of manufacturing a double-sided display panel may further include: providing a carrier substrate (not shown), manufacturing a double-sided display panel 100 on the carrier substrate, and peeling the double-sided display panel 100 from the carrier substrate after the double-sided display panel 100 is prepared.

In some embodiments, the carrier substrate may be a glass plate. Exemplarily, a laser lift-off method may be used to peel the double-sided display panel 100 from the carrier substrate.

Exemplarily, the double-sided display panel 10 is defined with a display area 101 and a bonding area 102; during processes of forming the electrochromic layer 40, the first light-shielding conductive layer 30, and the second inorganic layer 62, and the first substrate 61, a first via hole, a second via hole, a third via hole, and a fourth via hole are formed in the electrochromic layer 40, the first light-shielding conductive layer 30, the first inorganic layer 62, and the first substrate 61, respectively; and the first via hole, the second via hole, the third via hole, and the fourth via hole are defined correspondingly and communicated to each other.

Exemplarily, methods of forming the first via hole in the electrochromic layer 40, forming the second via hole in the first light-shielding conductive layer 30, forming the third via hole in the first inorganic layer 62, and forming the fourth via hole in the first substrate 61 may be etching or exposure.

Exemplarily, in a process of preparing the double-sided display panel 100, a second light-shielding conductive layer 70 is disposed between the first substrate 61 and the TFT layer 20, and a source-drain layer 26 of the second TFT 202 and the first light-shielding conductive layer 30 are both electrically connected to the second light-shielding conductive layer 70; the first via, the second via, the third via, and the fourth via collectively constitute a through hole 80; a part of the second light-shielding conductive layer 70 covers a sidewall of the through hole 80 and is in contact with the light-transmitting conductive layer 50 at a bottom of the through hole 80; and an area of the second light-shielding conductive layer 70 in contact with the first light-shielding conductive layer 30 is not connected to an area of the second light-shielding conductive layer 70 in contact with the light-transmitting conductive layer 50.

Figure 6:
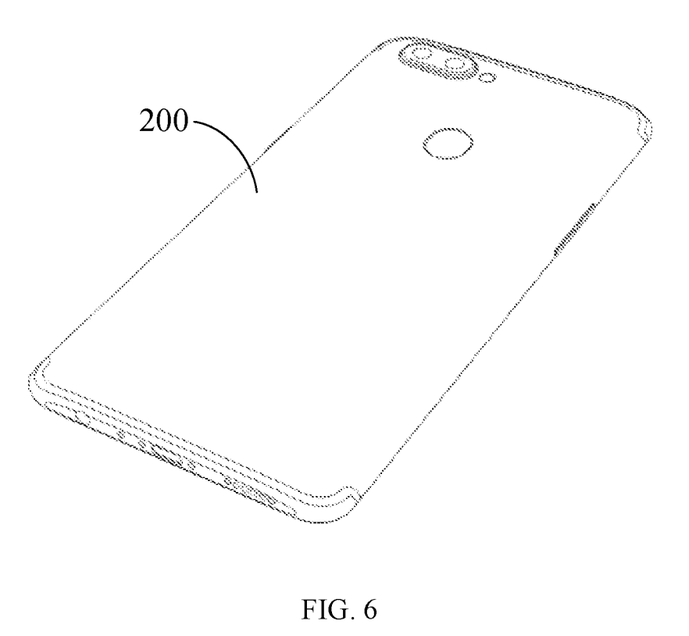
FIG. 6 is a schematic structural diagram of an electronic device provided by an embodiment of the present application.

Referring to FIG. 6, FIG. 6 is a schematic structural diagram of an electronic device provided by an embodiment of the present application. An embodiment of the present application also provides an electronic device 200, which includes the double-sided display panel 100 in any of the foregoing embodiments or the double-sided display panel 100 manufactured by the manufacturing method in any of the foregoing embodiments.

Exemplarily, the electronic device 200 may be a device with a display image such as a mobile phone, a tablet computer, a game device, a wearable device, etc., where the wearable device may be a smart bracelet, smart glasses, smart watch, smart decoration, etc.

It should be noted that both the front side and the back side of the electronic device 200 can display images, that is, the electronic device 200 provides a double-sided display effect.

The double-sided display panel, the method of manufacturing the double-sided display panel, and the electronic equipment provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A double-sided display panel, which comprises:
   a light-emitting device layer comprising a plurality of light-emitting devices;
   a thin film transistor (TFT) layer disposed on a side of the light-emitting device layer, wherein the TFT layer comprises a first TFT and a second TFT, and the first TFT is electrically connected to one of the light-emitting devices;
   a first light-shielding conductive layer disposed on a side of the TFT layer away from the light-emitting device layer, and electrically connected to the second TFT;
   an electrochromic layer disposed on a side of the first light-shielding conductive layer away from the TFT layer, and electrically connected to the first light-shielding conductive layer; and
a light-transmitting conductive layer disposed on a side of the electrochromic layer away from the first light-shielding conductive layer, and electrically connected to the electrochromic layer.

2. The double-sided display panel according to claim 1, wherein a first substrate and a first inorganic layer are disposed between the TFT layer and the first light-shielding conductive layer, the first substrate is disposed close to the TFT layer, and the first inorganic layer is disposed close to the first light-shielding conductive layer;
wherein a second substrate and a second inorganic layer are disposed on a side of the light-transmitting conductive layer away from the electrochromic layer, and the second inorganic layer is disposed between the first light-shielding conductive layer and the second substrate; and
wherein the first substrate and the second substrate are both flexible substrates.

3. The double-sided display panel according to claim 2, wherein a second light-shielding conductive layer is disposed between the first substrate and the TFT layer, a source-drain layer of the second TFT and the first light-shielding conductive layer are both electrically connected to the second light-shielding conductive layer.

4. The double-sided display panel according to claim 3, wherein the double-sided display panel is defined with a display area and a bonding area; in the bonding area, a through hole is defined through the electrochromic layer, the first light-shielding conductive layer, the first inorganic layer, and the first substrate; a part of the second light-shielding conductive layer covers a sidewall of the through hole and is in contact with the light-transmitting conductive layer at a bottom of the through hole; and an area of the second light-shielding conductive layer in contact with the first light-shielding conductive layer is not connected to an area of the second light-shielding conductive layer in contact with the light-transmitting conductive layer.

5. The double-sided display panel according to claim 4, wherein the through hole comprises a first via hole defined in the electrochromic layer, a second via hole defined in the first light-shielding conductive layer, a third via hole defined in the first inorganic layer, and a fourth via hole defined in the first substrate; cross-sectional areas of the first via hole, the second via hole, the third via hole, and the fourth via hole increase sequentially.

6. The double-sided display panel according to claim 2, wherein a material of each of the first inorganic layer and the second inorganic layer comprises at least one of silicon oxide and silicon nitride.

7. The double-sided display panel according to claim 1, wherein a material of the first light-shielding conductive layer comprises metal; and/or
a material of the light-transmitting conductive layer comprises a transparent conductive metal oxide.

8. The double-sided display panel according to claim 7, wherein a material of the first light-shielding conductive layer comprises at least one of silver, molybdenum, titanium, or copper; and/or
a material of the light-transmitting conductive layer comprises indium tin oxide.

9. The double-sided display panel according to claim 1, wherein the light-emitting device is an OLED.

10. The double-sided display panel according to claim 1, wherein the electrochromic layer comprises a plurality of electrochromic units disposed at intervals, the first light-shielding conductive layer comprises a plurality of conductive units, each of the electrochromic units is arranged corresponding to and electrically connected to one of the conductive units, and each of the conductive units is electrically connected to the source-drain layer of the second TFT.

11. The double-sided display panel according to claim 1, wherein the TFT layer further comprises a third TFT, a drain of the third TFT is connected to a gate of the second TFT, a source of the second TFT is connected to a driving power source, and a drain of the second TFT is connected to the electrochromic layer.

12. A method of manufacturing a double-sided display panel, comprising:
stacking a second substrate, a second inorganic layer, a light-transmitting conductive layer, an electrochromic layer, a first light-shielding conductive layer, a first inorganic layer, a first substrate, a thin film transistor (TFT) layer, and a light-emitting device layer in sequence to obtain the double-sided display panel;
wherein the light-emitting device layer comprises a plurality of light-emitting devices, the TFT layer comprises a first TFT and a second TFT, the first TFT is electrically connected to one of the light-emitting devices to drive the light-emitting devices to emit light, and the second TFT is electrically connected to the electrochromic layer to drive the electrochromic layer to change color.

13. The manufacturing method according to claim 12, wherein the first substrate and the second substrate are both flexible substrates; and
the manufacturing method further comprises: providing a carrier substrate, preparing the double-sided display panel on the carrier substrate, and peeling the double-sided display panel from the carrier substrate after the double-sided display panel is prepared.

14. The manufacturing method according to claim 13, wherein the double-sided display panel is defined with a display area and a bonding area; during processes of forming the electrochromic layer, the first light-shielding conductive layer, and the second inorganic layer, and the first substrate, a first via hole, a second via hole, a third via hole, and a fourth via hole are formed in the electrochromic layer, the first light-shielding conductive layer, the first inorganic layer, and the first substrate, respectively; and the first via hole, the second via hole, the third via hole, and the fourth via hole are defined correspondingly and communicated to each other.

15. The manufacturing method according to claim 14, wherein, in a process of preparing the double-sided display panel, a second light-shielding conductive layer is disposed between the first substrate and the TFT layer, and a source-drain layer of the second TFT and the first light-shielding conductive layer are both electrically connected to the second light-shielding conductive layer; the first via, the second via, the third via, and the fourth via collectively constitute a through hole; a part of the second light-shielding conductive layer covers a sidewall of the through hole and is in contact with the light-transmitting conductive layer at a bottom of the through hole; and an area of the second light-shielding conductive layer in contact with the first light-shielding conductive layer is not connected to an area of the second light-shielding conductive layer in contact with the light-transmitting conductive layer.

16. The manufacturing method according to claim 12, wherein a material of each of the first inorganic layer and the second inorganic layer comprises at least one of silicon oxide and silicon nitride.

17. The manufacturing method according to claim 12, wherein a material of the first light-shielding conductive layer comprises metal; and/or
   a material of the light-transmitting conductive layer comprises a transparent conductive metal oxide.

18. The manufacturing method according to claim 17, wherein a material of the first light-shielding conductive layer comprises at least one of silver, molybdenum, titanium, or copper; and/or
   a material of the light-transmitting conductive layer comprises indium tin oxide.

19. The manufacturing method according to claim 12, wherein the light-emitting device is an OLED.

20. An electronic device comprising the double-sided display panel according to claim 1.

* * * * *